US007061162B2

(12) United States Patent
Sato et al.

(10) Patent No.: US 7,061,162 B2
(45) Date of Patent: Jun. 13, 2006

(54) LAMINATED PIEZOELECTRIC ELEMENT

(75) Inventors: Kazuhide Sato, Aichi-pref. (JP); Shinichi Okamoto, Kariya (JP); Akira Fujii, Yokkaichi (JP)

(73) Assignee: Denso Corporation, Kariya (JP)

( * ) Notice: Subject to any disclaimer, the term of this patent is extended or adjusted under 35 U.S.C. 154(b) by 191 days.

(21) Appl. No.: 10/795,409

(22) Filed: Mar. 9, 2004

(65) Prior Publication Data
US 2004/0178701 A1    Sep. 16, 2004

(30) Foreign Application Priority Data
Mar. 12, 2003  (JP)  ............................. 2003-066227
Jan. 21, 2004  (JP)  ............................. 2004-013412

(51) Int. Cl.
*H01L 41/08*    (2006.01)
(52) U.S. Cl. ....................................................... 310/328
(58) Field of Classification Search ................ 310/328, 310/363, 364, 366; H01L 41/08
See application file for complete search history.

(56) References Cited

U.S. PATENT DOCUMENTS

| | | | | |
|---|---|---|---|---|
| 4,978,881 A | * | 12/1990 | Wakita et al. | ............... 310/328 |
| 5,163,209 A | * | 11/1992 | Harada et al. | ............... 310/328 |
| 5,175,465 A | * | 12/1992 | Um et al. | .................... 310/328 |
| 5,233,260 A | * | 8/1993 | Harada et al. | ............... 310/328 |
| 5,245,734 A | * | 9/1993 | Issartel | ....................... 310/364 |
| 6,700,306 B1 | * | 3/2004 | Nakamura et al. | .......... 310/336 |

FOREIGN PATENT DOCUMENTS

| | | |
|---|---|---|
| JP | 2001-69771 | 3/2001 |
| JP | 2001-77436 | 3/2001 |
| JP | 2001-102647 | 4/2001 |
| JP | 2001-244513 | 9/2001 |
| JP | 2002-111088 | 4/2002 |

* cited by examiner

*Primary Examiner*—Darren Schuberg
*Assistant Examiner*—Karen Beth Addison
(74) *Attorney, Agent, or Firm*—Nixon & Vanderhye P.C.

(57) ABSTRACT

A laminated piezoelectric element (1) having a ceramic laminate (10) formed by alternatively laminating a plurality of piezoelectric layers (11) and a plurality of internal electrode layer (21). A side surface (101) provided with the first side-surface electrode (31) is further provided with first recessed groove portions (41) which are the recessed grooves exposing the ends of the second internal electrodes (22) in the bottom portions (410) thereof, and a side surface (102) provided with the second side-surface electrode (32) is further provided with second recessed groove portions (42) which are the recessed grooves exposing the ends of the first internal electrodes (21) in the bottom portions. The first groove portions (41) and the second groove portions (42) are filled with an insulating filler material (5) having electrically insulating property so as to cover the ends of the second internal electrodes (22) and the ends of the first internal electrodes (21). The insulating filler material (5) comprises an insulating resin (50) having electrically insulating property and inorganic particles (51) of an inorganic material contained in the insulating resin (50).

17 Claims, 12 Drawing Sheets

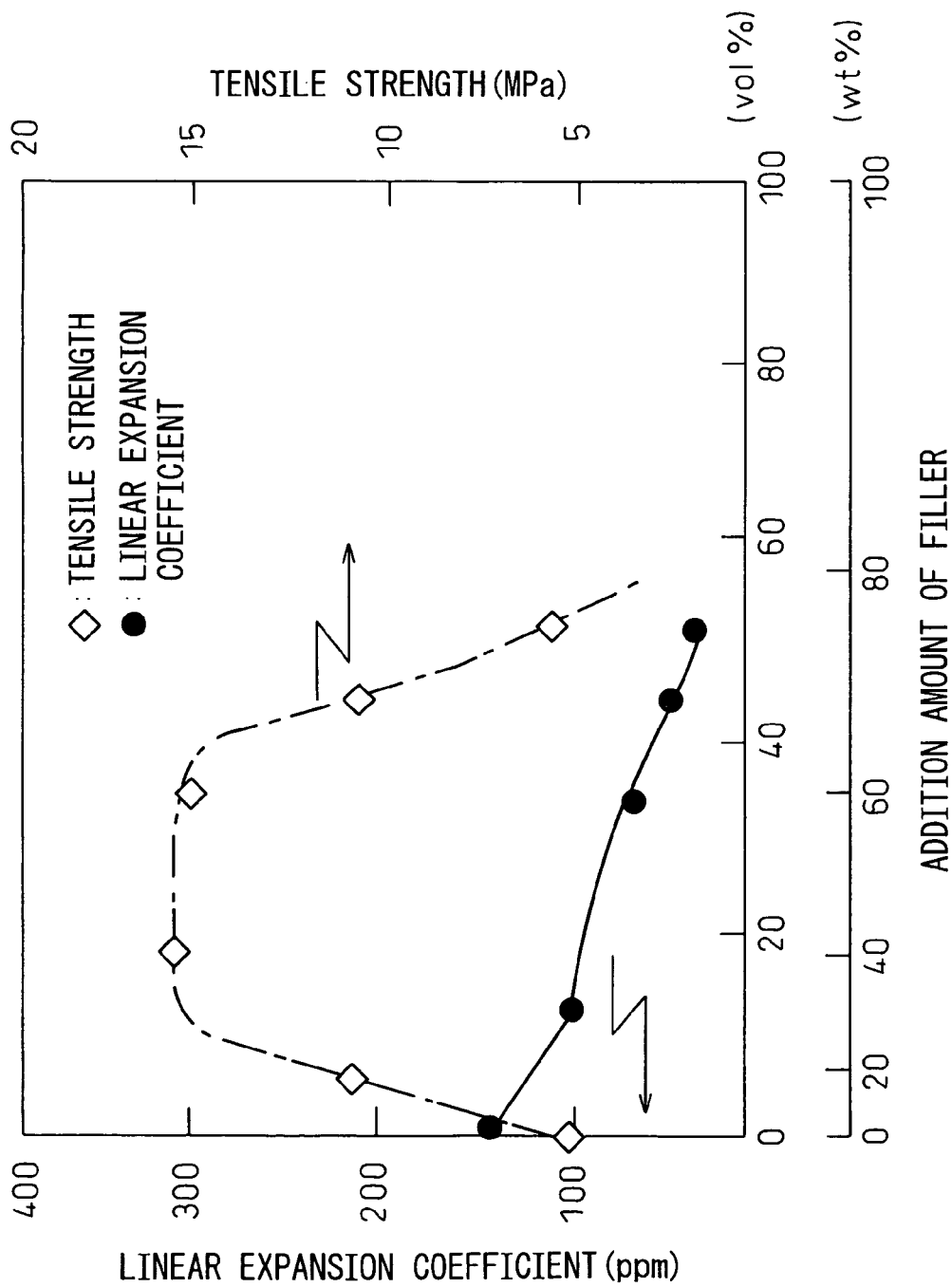

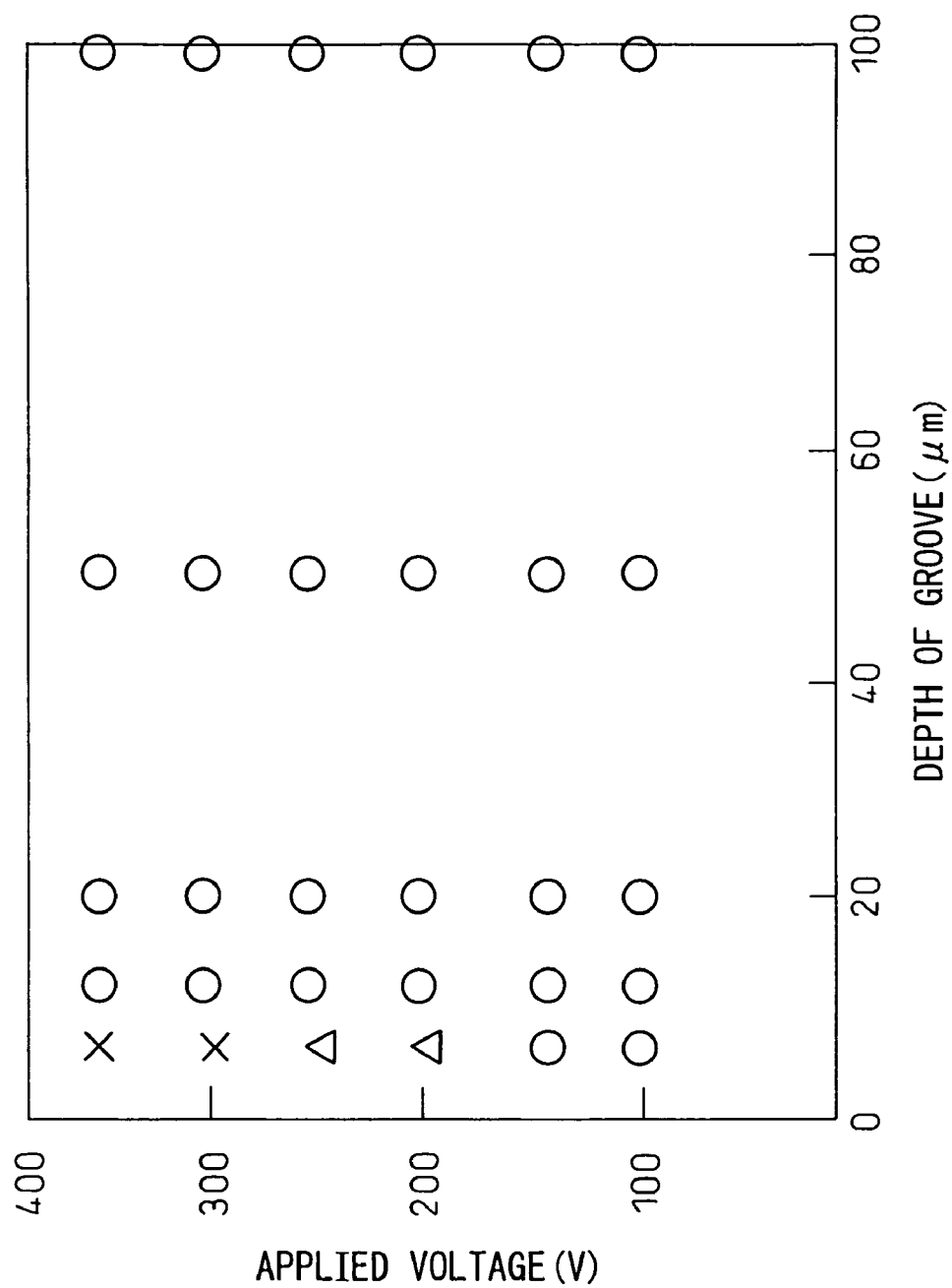

LAMINATED PIEZOELECTRIC ELEMENT

This application claims priority to JP Application No. 2003-066227, filed 12 Mar. 2003 and JP Application No. 23004-013412, filed 21 Jan. 2004. The entire contents of this application are incorporated herein by reference.

BACKGROUND OF THE INVENTION

1. Field of the Invention

The present invention relates to a laminated piezoelectric element that can be applied to a piezoelectric actuator and the like.

2. Description of the Related Art

A laminated piezoelectric element of the whole-surface electrode structure in which the internal electrode layers are covering the whole surfaces of the piezoelectric layers, produces a larger displacement than a partial electrode structure in which the internal electrode layers have portions without covering the piezoelectric layers, and permits less stress to be concentrated at the ends of the internal electrode layers. Employment of the whole-surface electrode structure, therefore, makes it possible to obtain a laminated piezoelectric element having higher displacement characteristics and higher reliability than those of the partial electrode structure.

In the case of the whole-surface electrode structure, the ends of the internal electrode layers are exposed on the whole side surfaces of the laminated piezoelectric element. The ends must be electrically conductive to one of the pair of side-surface electrodes but must be electrically insulated from the other side-surface electrode. As the laminated piezoelectric element undergoes displacement, a large stress is applied to the insulating portions between the side-surface electrodes and the internal electrode layers. Therefore, a structural contrivance is necessary for enhancing the insulation between the internal electrode layers and the side-surface electrodes. An insulating structure has heretofore been proposed according to which grooves are formed in the side surfaces of the laminated piezoelectric element of the whole-surface electrode structure, and are filled with an insulating resin (see, for example, Japanese Unexamined Patent Publication (Kokai) Nos. 2001-69771, 2001-102647, 2002-111088, 2001-244513, and 2001-77436).

With the above conventional insulating structure, however, there exists a large difference in the coefficient of linear expansion between the insulating resin filled in the grooves and the piezoelectric material. Therefore, peeling occurs in the interface between the insulating resin and the piezoelectric layer or cracks occur in the insulating resin at a relatively early time in the reliability testing such as cooling/heating cycle testing. The cracks trigger a short-circuit among the internal electrode layers or between the internal electrode layers and the side-surface electrodes that are to be insulated therefrom.

SUMMARY OF THE INVENTION

The present invention is directed to solving the above-mentioned prior art problems, and provides a laminated piezoelectric element enhancing reliability in the structure of insulation between the internal electrode layers and the side-surface electrodes.

A first invention is concerned with a laminated piezoelectric element having a ceramic laminate formed by alternately laminating a plurality of piezoelectric layers comprising a piezoelectric material and a plurality of internal electrode layers having electric conductivity, the side surfaces of the ceramic laminate being provided with a first side-surface electrode and a second side-surface electrode, and the internal electrode layers comprising, being alternately arranged, the first internal electrodes conducting to the first side-surface electrode and the second internal electrodes conducting to the second side-surface electrode, in which the side surface of the ceramic laminate provided with the first side-surface electrode is further provided with first recessed groove portions which are the recessed grooves exposing the ends of the second internal electrodes in the bottom portions thereof, and the side surface thereof provided with the second side-surface electrode is further provided with second recessed groove portions which are the recessed grooves exposing the ends of the first internal electrodes in the bottom portions thereof, the first groove portions and the second groove portions are filled with an insulating filler material having electrically insulating property so as to cover the ends of the second internal electrodes and the ends of the first internal electrodes, and the insulating filler material comprises an insulating resin having an electrically insulating property and inorganic particles comprising an inorganic material in the insulating resin.

In the laminated piezoelectric element of the present invention, as described above, the insulating filler material filled in the first recessed groove portions and in the second recessed groove portions comprises the insulating resin and the inorganic particles contained therein. Therefore, the insulating structure based on the insulating filler material features remarkably improved reliability compared to that of the prior art.

Namely, the insulating resin has a linear expansion coefficient much higher than that of the piezoelectric material that constitutes the ceramic laminate. When the insulating filler material is constituted by using the insulating resin only, therefore, thermal stress builds up between the piezoelectric material and the insulating resin as the cooling/heating cycle is repeated, developing inconvenience such as cracks.

According to the present invention, on the other hand, the insulating resin contains inorganic particles. The inorganic particles have a smaller linear expansion coefficient as compared to that of the insulating resin. Therefore, the insulating filler material containing the inorganic particles as a whole exhibits a linear expansion coefficient that is very decreased compared to that of the insulating resin alone.

Therefore, even when the cooling/heating cycle is repeated for the laminated piezoelectric element, the insulating filler material filled in the first recessed groove portions and in second recessed groove portions is maintained in a healthy state suppressing the occurrence of cracks or gaps.

Therefore, the above laminated piezoelectric element features improved reliability in the structure of insulation between the internal electrode layers and the side-surface electrodes as compared to the prior art.

A second invention is concerned with an injector which is so constituted as to control the fuel injection by opening and closing a valve body by utilizing the displacement of a piezoelectric actuator, in which the piezoelectric actuator comprising a laminated piezoelectric element according to the present invention.

The injector of the present invention uses a piezoelectric actuator comprising the above-mentioned excellent laminated piezoelectric element. As described above, the piezoelectric actuator has a high reliability in the structure of insulation between the internal electrode layers and the side surface electrodes and features very excellent durability. Even when used as an injector under such severe conditions as high-temperature atmosphere, therefore, the piezoelectric actuator suppresses the occurrence of cracks while it is in operation, offers enhanced durability, and makes it possible to improve performance and reliability of the injector as a whole.

BRIEF DESCRIPTION OF THE DRAWINGS

FIG. 15 is a graph showing relationships among the amount of addition of inorganic particles, linear expansion coefficient and tensile strength of when the insulating resin is epoxy in Example 4; and FIG. 16 is a graph showing a relationship between the depth of the recessed grooves and the insulating properties in Example 5.

DESCRIPTION OF THE PREFERRED EMBODIMENTS

Figure 1:
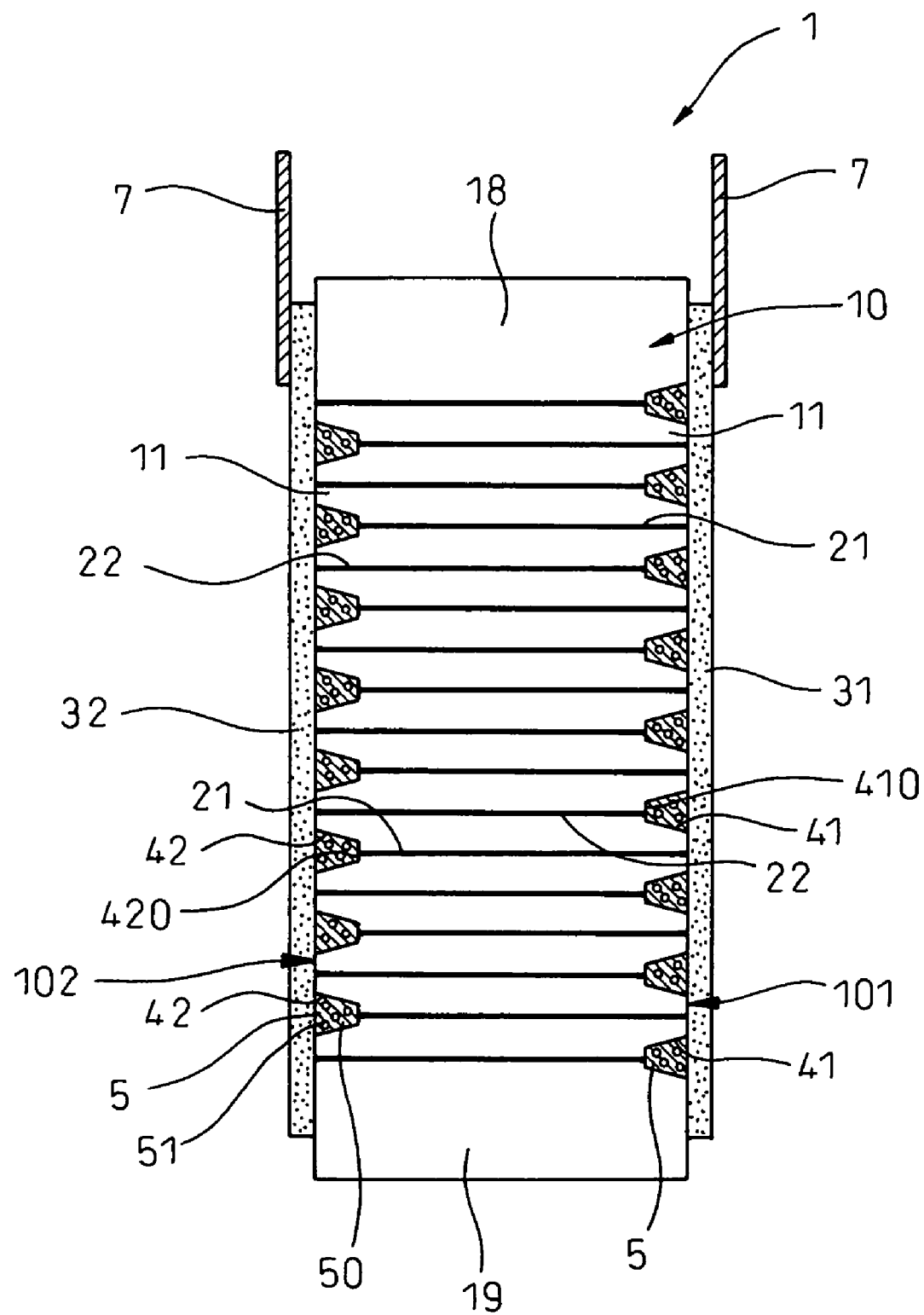
FIG. 1 is a schematic view illustrating the structure of a laminated piezoelectric element in Example 1.

In the present invention, it is desired that the inorganic particles comprise alumina, silica, silicon nitride or boron nitride.

As the inorganic particles, there can be used any known particles provided they are made of an inorganic material having a small linear expansion coefficient. In particular, the alumina, silica, silicon nitride or boron nitride has a very small linear expansion coefficient as compared to that of the insulating resin, and is suited for being used as the inorganic particles.

As the insulating resin for constituting the insulating filler material, there can be used, for example, a silicone resin, an urethane resin, a polyimideamide resin, a polyimide resin or an epoxy resin. These resins have linear expansion coefficients of as very large as about 200 to about 300 ppm/° C. On the other hand, the piezoelectric layers constituting the ceramic laminate have a linear expansion coefficient of as very small as about 0.5 to about 5 ppm/° C. The linear expansion coefficient of the inorganic particles is close to the linear expansion coefficient of the piezoelectric layers. By containing the inorganic particles in the insulating resin, therefore, the linear expansion coefficient of the above insulating filler material can be decreased down to about 10 to 200 ppm/° C.

It is desired that the content of the inorganic particles in the insulating filler material is about 10 to 70% by weight and, more desirably, about 30 to 60% by weight. When the content of the inorganic particles is smaller than 10% by weight, it is likely that the effect is not enough for lowering the linear expansion coefficient of the insulating filler material. Preferably, therefore, the content of the inorganic particles is not smaller than 30% by weight. When the content of the inorganic particles exceeds 70% by weight, further, the ratio of the insulating resin becomes too small and the insulating filler material as a whole exhibits a decreased strength. More preferably, therefore, the content of the inorganic particles is not larger than 60% by weight.

It is further desired that the inorganic particles have an average particle size of about 0.1 to 30 μm and, more desirably, about 1 to 10 μm. When the average particle size of the inorganic particles is smaller than 0.1 μm, there tends to occur such inconvenience as a decrease in the workability due to aggregation of the inorganic particles and due to a rise in the viscosity of the insulating resin. More preferably, therefore, the average particle size of the inorganic particles is not smaller than 1 μm. As the average particle size of the inorganic particles exceeds 30 μm, on the other hand, the inorganic particles fail to be homogeneously distributed in the insulating resin, and the insulating filler material does not exhibit a uniform linear expansion coefficient. As the average particle size exceeds 10 μm, further, the inorganic particles tend to be precipitated and are not homogeneously dispersed.

It is desired that the insulating filler material has a linear expansion coefficient of about 10 to 200 ppm/° C. and, more desirably, about 10 to 100 ppm/° C. The linear expansion coefficient of the insulating filler material as a whole can be adjusted relying upon the properties and amounts of the inorganic particles that are contained therein. It is desired that the thermal expansion coefficient of the insulating filler material is adjusted to lie in a range of about 10 to 200 ppm/° C. This makes it possible to greatly increase the durability of the insulating structure by using the insulating filler material and to obtain a laminated piezoelectric element having a higher reliability. To further increase the effect of lowering the stress by lowering the linear expansion coefficient of the insulating filler material, it is desired that the linear expansion coefficient is not higher than 100 ppm/° C.

It is desired that an obtuse angle is subtended by the side surfaces of the ceramic laminate and by the side wall surfaces of the first recessed groove portions and of the second recessed groove portions. In this case, even when a stress is exerted on the side surfaces of the ceramic laminate, stress concentrates little in the corner portions subtended by the side surfaces of the ceramic laminate and by the side wall surfaces of the first recessed groove portions and of the second recessed groove portions, preventing the occurrence of cracks.

It is desired that the first side-surface electrode and the second side-surface electrode are constituted by electrically conducting resin layers containing an electrically conducting material in a resin material, and the resin material has substantially the same composition as that of the insulating resin. In this case, the resin material constituting the first side-surface electrode and the second side-surface electrode has nearly the same composition as the insulating resin constituting the insulating filler material, making it possible to improve the adhesion between the two and, hence, to improve the junction strength between the two.

The electrically conducting resin layers forming the first side-surface electrode and the second side-surface electrode have substantially the same constitution as that of the insulating filler material, which are obtained by containing the electrically conducting material or the inorganic particles in the resins having substantially the same composition. As the electrically conducting material, further, there can be used metal particles having a small linear expansion coefficient, such as silver, copper or Ni. Therefore, the linear expansion coefficient of the electrically conducting resin layer becomes very smaller than the linear expansion coefficient of the resin material, making it possible to decrease a difference from the linear expansion coefficient of the insulating filler material. Therefore, the junction stability is further enhanced between the electrically conducting resin layer and the insulating filler material.

It is desired that the internal electrode layers contain copper as a main component thereof.

As the internal electrode layers, there can be used silver or a silver-palladium alloy that is usually used as a material for imparting electric conduction. As described above, however, it is desired to use copper. The internal electrode material containing silver tends to develop migration in a humid atmosphere. To cope with this, it can be contrived to increase the amount of palladium or to increase the depth of the first recessed groove portions and of the second recessed groove portions accompanied, however, by a problem. Namely, palladium is very expensive and an increase in the amount thereof drives up the cost. An increase in the depth of the grooves results in a decrease in the effective electrode area for applying a voltage of positive or negative polarity to the piezoelectric layers, making it difficult to obtain a favorable displacement.

On the other hand, if the internal electrode layers are formed by using copper which is inexpensive, migration occurs less than when silver is used, and the depth of grooves can be decreased, accomplishing both favorable displacement and a decrease in the cost. If migration only needs be prevented, then, any other metal can be used arousing, however, a problem concerning the electric conduction.

Silver has a linear expansion coefficient of 19 ppm/° C. while copper has a linear expansion coefficient of as small as 17 ppm/° C. Therefore, the linear expansion coefficient of the internal electrode layers can be brought close to that of the piezoelectric layers when copper is used. This further enhances the reliability of the laminated piezoelectric element. When the silver-palladium alloy is used, too, the linear expansion coefficient is close to that of silver. Therefore, use of copper is advantageous as compared to the silver-palladium alloy.

The internal electrode layers containing copper are formed by, for example, plating copper on the surfaces of the piezoelectric layers or by applying a copper foil between the piezoelectric layers.

It is desired that the first recessed grooves and the second recessed grooves have depths of smaller than 50 μm and, more desirably, not smaller than 10 μm and smaller than 50 μm. In this case, there is a little reduction in the effective electrode areas of the internal electrode layers covering the piezoelectric layers, and the laminated piezoelectric element maintains the displacement to a sufficient degree. When the depth of the grooves is not smaller than 50 μm, the displacement characteristics may decrease when the depth of the grooves is smaller than 10 μm, on the other hand, the effect of insulation (breakdown voltage effect) by the insulating filler material may decrease.

It is desired that if the thickness of the piezoelectric layer is denoted by L, the first recessed grooves and the second recessed grooves have widths, which are the sizes in a direction in which the piezoelectric layers are laminated, lying in a range of about 0.1 L to 1.8 L. With the width of the grooves being smaller than 0.1 L, a tensile stress exerts on the insulating filler material when the laminated piezoelectric element undergoes the displacement, and the insulating filler material may peel off the side wall surfaces of the grooves. If the width of the grooves exceeds 1.8 L, the effect of thermal stress is not avoided in the cooling/heating cycles due to a still existing difference in the linear expansion coefficient from the piezoelectric material despite the linear expansion coefficient of the insulating filler material as a whole is lowered by adding inorganic particles as described above, and there may occur such inconveniences as cracks and peeling.

It is desired that the volume content of the inorganic particles in the insulating filler material is about 3 to 45% by volume. When the volume content of the inorganic particles is smaller than 3% by volume, the effect may not be sufficient for lowering the linear expansion coefficient of the insulating filler material. When the volume content of the inorganic particles exceeds 45% by volume, on the other hand, the ratio of the insulating resin becomes so small that the insulating filler material as a whole exhibits a decreased strength.

It is desired that the piezoelectric layers are made of a lead zirconate titanate which is an oxide of the formula $Pb(Zr, Ti)O_3$ having a perovskite structure. Lead zirconate titanate (PZT) has excellent piezoelectric characteristics and makes it possible to obtain the laminated piezoelectric element having very excellent characteristics.

EXAMPLES

The present invention will be further described with reference to the examples thereof. Note, however, that the present invention should not be restricted to these examples.

Example 1

A laminated piezoelectric element according to one example of the present invention will now be described with reference to FIGS. 1 to 8.

Referring to FIG. 1, a laminated piezoelectric element 1 of this example has a ceramic laminate 10 obtained by alternately laminating a plurality of piezoelectric layers 11 made of a piezoelectric material and a plurality of internal electrode layers 21 and 22 having electric conductivity. A first side-surface electrode 31 and a second side-surface electrode 32 are provided on the side surfaces 101 and 102 of the ceramic laminate 10. The internal electrode layers 21 and 22 are the first internal electrodes 21 electrically communicating to the first side-surface electrode 31, and the second internal electrodes 22 electrically communicating to the second side-surface electrode 32.

Figure 2:
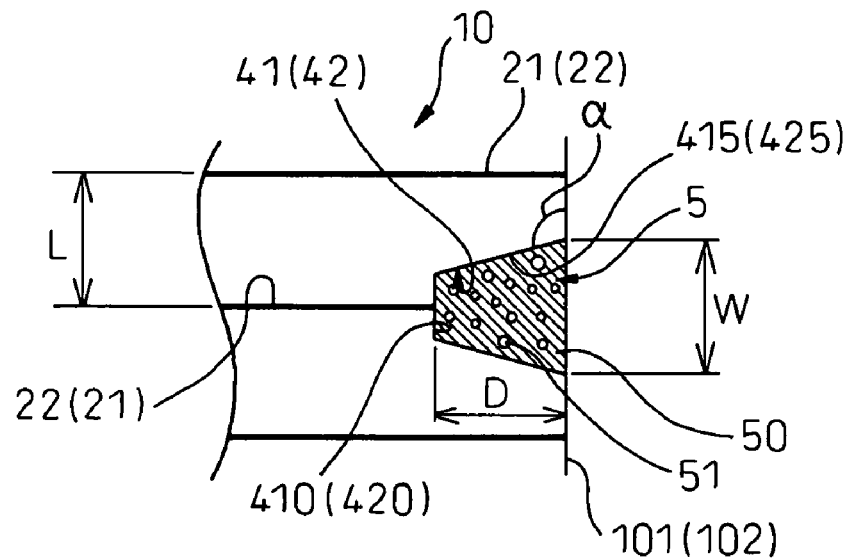
FIG. 2 is a schematic view illustrating a state of being filled with an insulating filler material in Example 1.

Referring to FIGS. 1 and 2, a side surface 101 provided with the first side-surface electrode 31 of the ceramic laminate 10 is further provided with first recessed groove portions 41 which are the recessed grooves exposing the ends of the second internal electrodes 22 in the bottom portions 410 thereof, and a side surface 102 thereof provided with the second side-surface electrode 32 is further provided with second recessed groove portions which are the recessed grooves exposing the ends of the first internal electrodes in the bottom portions 420 thereof. The first groove portions 41 and the second groove portions 42 are filled with an insulating filler material 5 having electrically insulating property so as to cover the ends of the second internal electrodes 22 and the ends of the first internal electrodes 21. Further, the insulating filler material 5 comprises an insulating resin 50 having electrically insulating property and inorganic particles 51 of an inorganic material contained in the insulating resin 50.

The laminated piezoelectric element 1 will be described in further detail.

Figure 5:
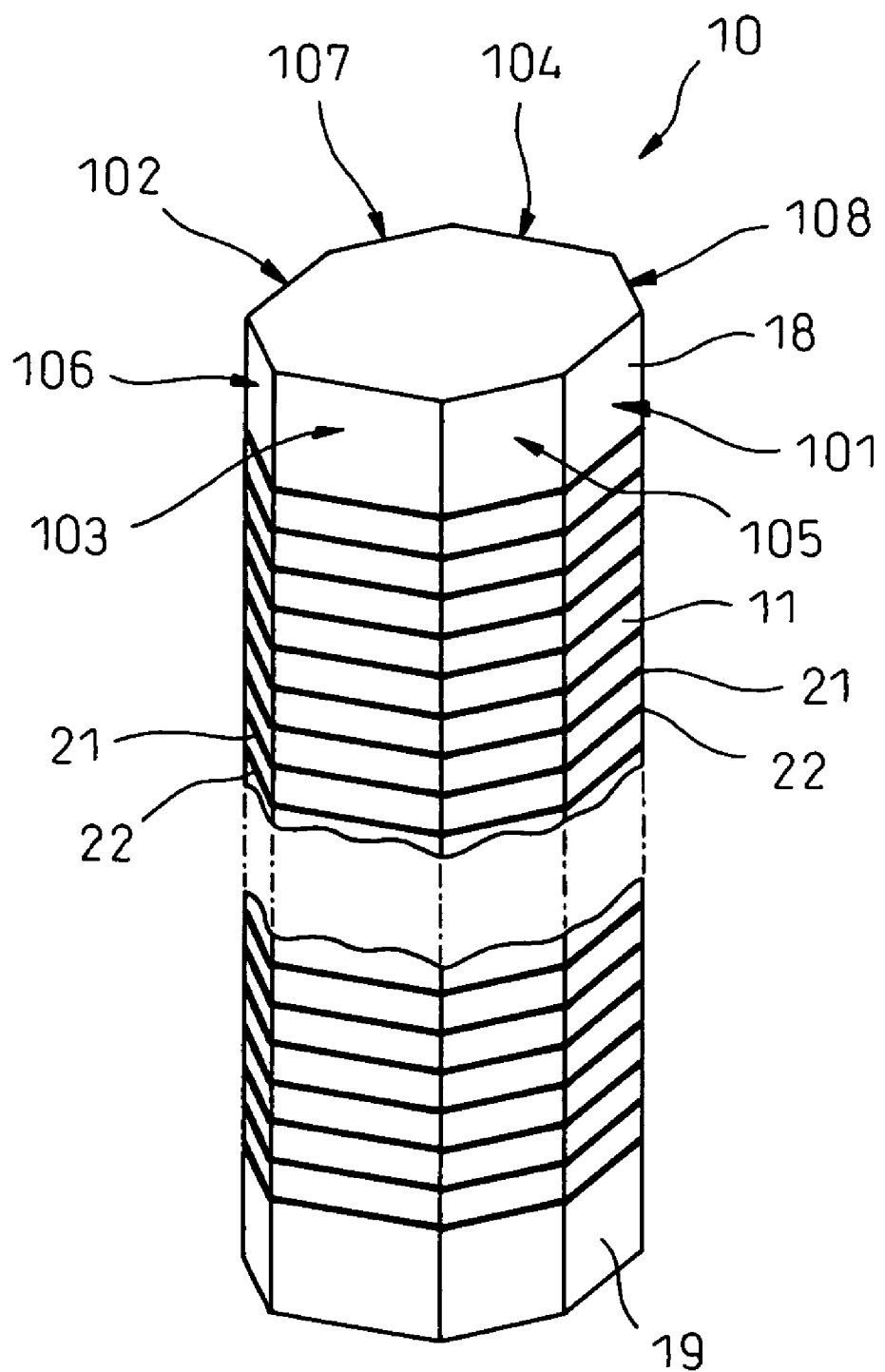
FIG. 5 is a schematic view illustrating the ceramic laminate of the shape of an octagonal pole in Example 1.
Figure 8:
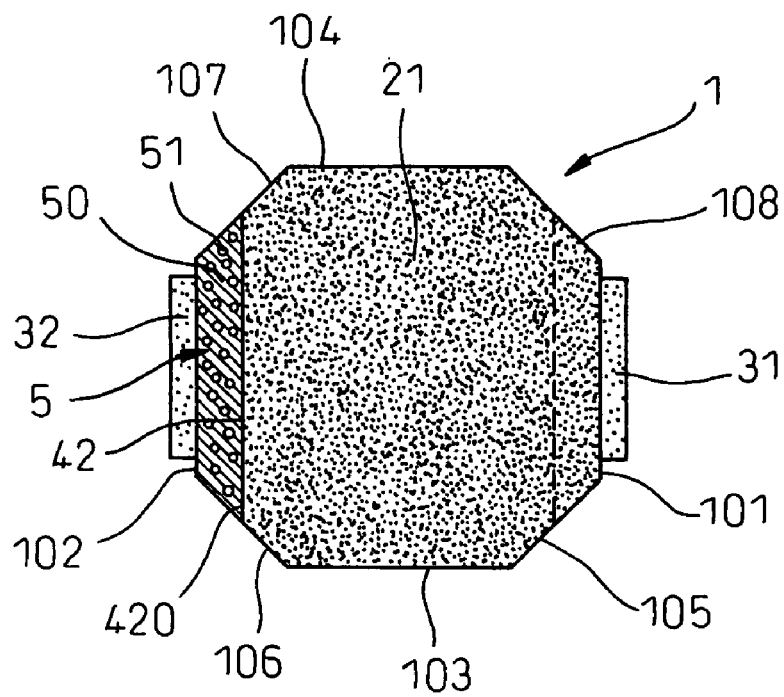
FIG. 8 is a schematic view illustrating the laminated piezoelectric element in cross section at right angles with the direction of lamination in Example 1.

Referring to FIGS. 1, 5 and 8, the laminated piezoelectric element 1 has an octagonal pole-like ceramic laminate 10 constituted by alternately laminating piezoelectric layers 11 that expand and contract upon the application of a voltage and internal electrodes (first internal electrodes and second internal electrodes) 21 and 22 for applying the voltage. Among the side surfaces thereof, a pair of side surfaces 101 and 102 are provided with the first side-surface electrode 31 and the second side-surface electrode 32, and to which are further connected lead wires 7 for connection to external electrodes. In this example, the ceramic laminate 10 is provided with so-called dummy layers 18 and 19 at the upper end and at the lower end thereof in the direction of lamination without being sandwiched by the internal electrode layers 21 and 22. The laminate may have a cylindrical shape, a triangular pole shape or a square pole shape in addition to the above-mentioned shape. The external electrodes need not be opposed to each other. The lead wires may be formed up to the lower portions of the laminate not being limited to the upper portions thereof.

Referring to FIGS. 1, 2 and 8, the first internal electrode 21 is exposed at its end on the side surface 101 and is directly contacted to the first side-surface electrode 31. On the side surface 102 opposed to the side surface 101, on the other hand, the first internal electrode 21 is exposed in the bottom portion 420 of the second recessed groove portion 42 and is covered with the insulating filler material 5 filled in the second recessed groove portion 42. The second side-surface electrode 32 is disposed on the outer side of the insulating filler material 5.

Similarly, the second internal electrode 22 is exposed at its end on the side surface 102 and is directly contacted to the second side-surface electrode 32. On the side surface 101 opposed to the side surface 102, on the other hand, the second internal electrode 22 is exposed in the bottom portion 410 of the first recessed groove portion 41 and is covered with the insulating filler material 5 filled in the first recessed groove portion 41. The first side-surface electrode 31 is disposed on the outer side of the insulating filler material 5.

As shown in FIGS. 2 and 8, the first recessed groove portions 41 and the second recessed groove portions 42 have bottom portions 410 and 420 positioned nearly in parallel with the side surfaces 101 and 102, and have a groove depth D (see, FIG. 2) of about 40 µm. Further, the first recessed groove portions 41 and the second recessed groove portions 42 have a groove width w (see, FIG. 2) of about 60 µm which is about 75% of the thickness of the piezoelectric layers 11.

Further, as shown in FIG. 2, an angle a which is an obtuse angle is subtended by the side surfaces 101 and 102 of the ceramic laminate 10 and by the side wall surfaces 415 and 425 of the first recessed groove portions 41 and of the second recessed groove portions 42. Concretely, the angle is set to be 110°. As shown in FIG. 2, the first recessed groove portions 41 and the second recessed groove portions 42 have a nearly trapezoidal shape with the bottom portions 410 and 420 as upper sides.

The first recessed groove portions 41 and the second recessed groove portions 42 are filled with the insulating filler material 5 comprising the insulating resin 50 having electrically insulating property and inorganic particles 51 of an inorganic material contained in the insulating resin 50. In this example, an epoxy resin is used as the insulating resin 50 and alumina particles having an average particle size of 5 µm are used as the inorganic particles 51. The ratio of content of the inorganic particles 51 in the insulating filler material 5 (insulating resin 50+inorganic particles 51) has been adjusted to be 60% by weight.

The first side-surface electrode 31 and the second side-surface electrode 32 are constituted by the electrically conducting resin layers obtained by containing an electrically conducting material in a resin material having electrically insulating property. As the above resin material in this example, there is used an epoxy resin having the same composition as that of the above insulating resin 50. As the electrically conducting material, further, there is used a silver filler at a ratio of 70% by weight.

Next, briefly described below is a method of producing the laminated piezoelectric element 1 having the constitution as described above.

Conducted, first, is a step of firing the piezoelectric layer for obtaining the piezoelectric layer 11 by firing a ceramic green sheet that is the piezoelectric material.

In this example, the green sheet is prepared as described below to employ the PZT as the piezoelectric layer 11. First, powders of lead oxide, zirconium oxide, titanium oxide, niobium oxide and strontium carbonate, which are the principal starting materials of the piezoelectric material, are weighed to obtain a desired composition. By taking the evaporation of lead into consideration, further, the above components are so mixed as to be richer by 1 to 2% than the stoichiometric ratio of the above mixture composition. The mixture is dry-mixed by using a mixer and is, then, calcined at 800 to 950° C.

Then, pure water and a dispersant are added to the calcined powder to prepare a slurry thereof, which is, then, wet-milled by using a pearl mill. The milled material is dried and dewaxed, and to which are added a solvent, a binder, a plasticizer and a dispersant, which are, then, mixed together by using the ball mill, Then, the slurry is stirred in a vacuum device by using a stirrer, vacuum-defoamed and is adjusted for its viscosity.

The slurry is molded into a green sheet of a predetermined thickness by using a doctor blade device.

The recovered green sheet is punched by a pressing machine or is cut by a cutter into a square shape of a side length of 7 mm. The green sheet may be molded into a square shape, an elliptic shape or a barrel shape depending upon the shape of the laminated piezoelectric element that is to be obtained.

Next, the green sheet is dewaxed and is fired to obtain the piezoelectric layer 11. The dewaxing is conducted by holding the green sheet at a temperature of 400 to 700° C. for a predetermined period of time in an electric furnace. The firing is conducted by holding the green sheet at a temperature of 900 to 1200° C. for a predetermined period of time. In this example, there is thus obtained a fired piezoelectric layer 11 having a thickness of 80 μm and comprising PZT which is substantially an oxide of the formula $Pb(Zr,Ti)O_3$ having a perovskite structure.

Figure 3:
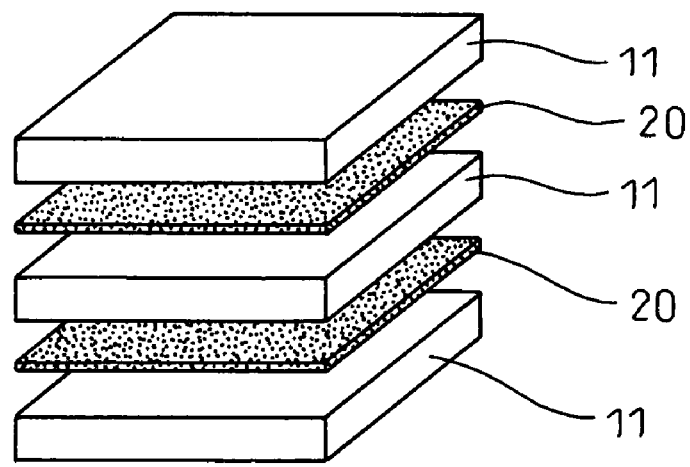
FIG. 3 is a schematic view illustrating the order of laminating a ceramic laminate in Example 1.

Referring next to FIG. 3, a step is conducted for preparing a laminate by alternately laminating the thus obtained piezoelectric layers 11 and the electrode materials 20 containing Cu.

In this example, a copper foil comprising copper of a purity of 99.9% and having a thickness of 5 μm is used as the electrode material 20. As shown in FIG. 3, the copper foil has a square shape of a side length of 7 mm like the piezoelectric layer 11. The piezoelectric layers 11 and the electrode materials 20 are alternately laminated, and a laminate is prepared having 250 piezoelectric layers 11 that are laminated. Dummy piezoelectric layers 11 are arranged at the upper and lower ends of the laminate in the direction of lamination.

Next, the laminate is disposed in the furnace in a state where a load of about 3 MPa is exerted thereon from the direction of lamination, the atmosphere in the furnace is evacuated up to a vacuum degree of $1 \times 10^{-2}$ Pa and, then, $N_2$ gas which is an inert gas is introduced into the furnace so as to maintain a pressure of 10 Pa in the furnace. Then, a step of heat-junction is conducted to join the internal electrode layers 21, 22 comprising the electrode material 20 and the piezoelectric layers 11 by maintaining a temperature of 960° C. for 10 minutes.

Figure 4:
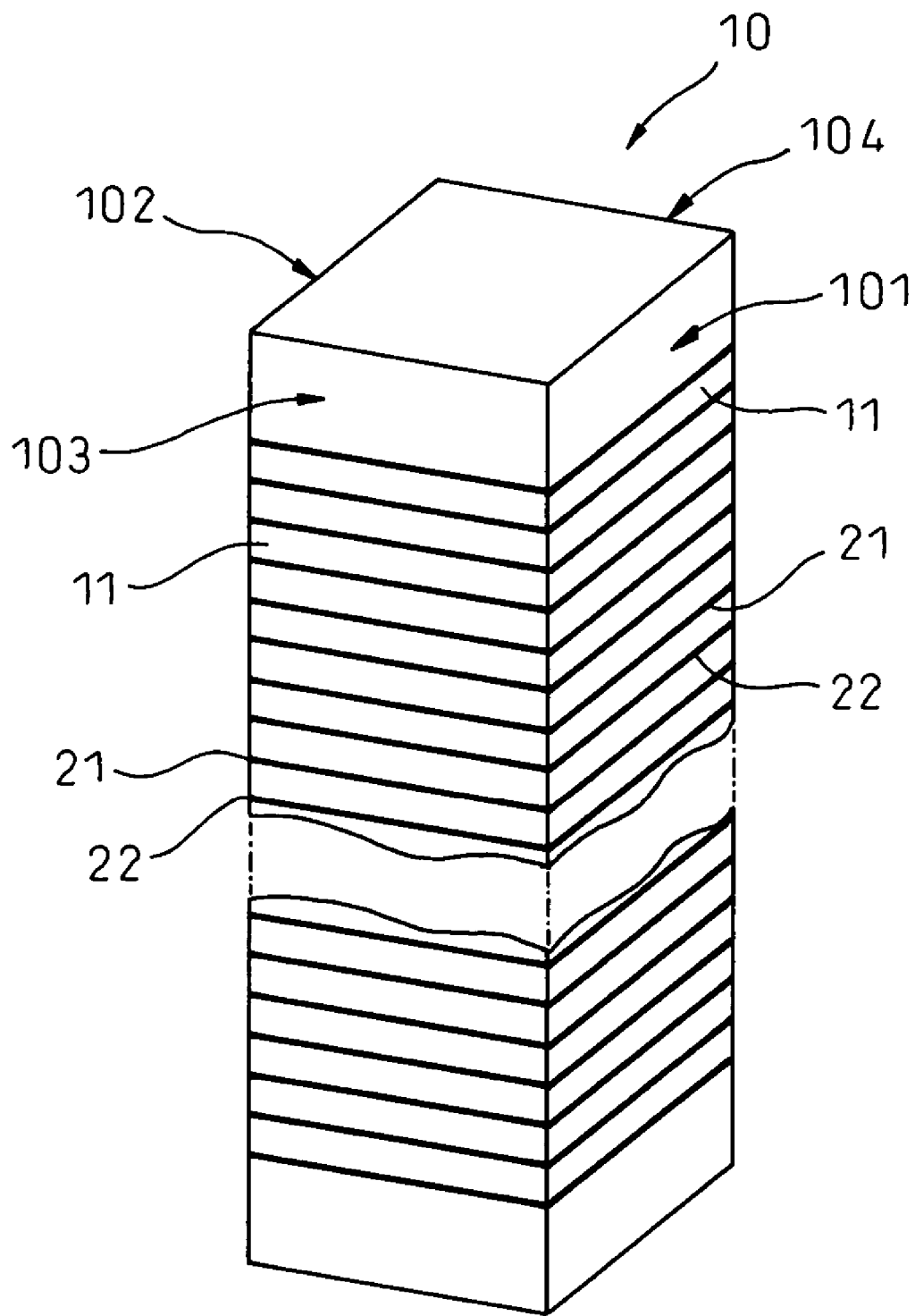
FIG. 4 is a schematic view illustrating the ceramic laminate of the shape of a square pole in Example 1.

Then, as shown in FIG. 4, there is obtained the ceramic laminate 10 of nearly a square pole shape having four side surfaces 101 to 104, and having internal electrode layers 21 and 22 exposed at the ends thereof on all of the side surfaces thereof.

Next, as shown in FIG. 5, the corners of the square pole are flatly ground to newly form four side surfaces 105 to 108, thereby to form a ceramic laminate 10 of nearly an octagonal pole shape.

Figure 6:
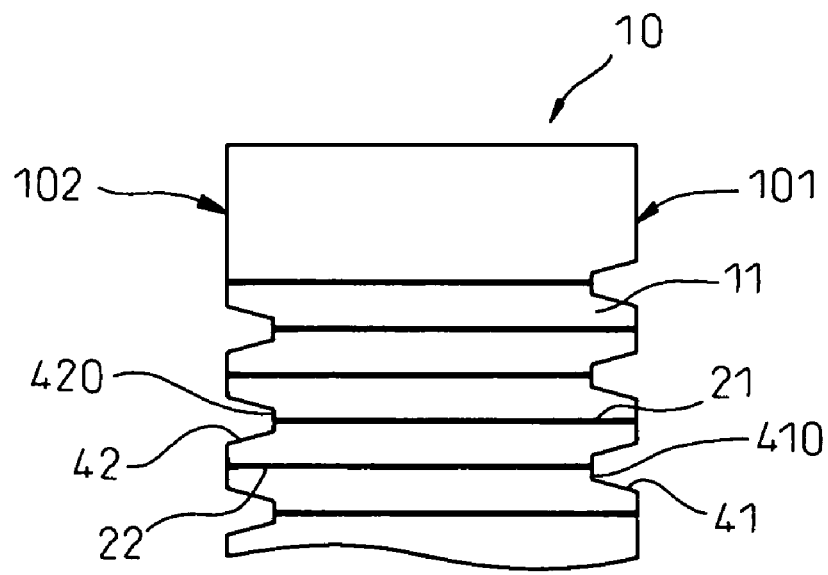
FIG. 6 is a schematic view illustrating a state where first recessed groove portions and second recessed groove portions are formed in Example 1.

Thereafter, as shown in FIG. 6, grooves are formed in the side surface 101 of the ceramic laminate 10 by the irradiation with a laser beam along the ends of the second internal electrodes 22 that are exposed to thereby form first recessed groove portions 41. Similarly, further, grooves are formed in the side surface 102 of the ceramic laminate 10 by the irradiation with a laser beam along the ends of the first internal electrodes 21 that are exposed to thereby form second recessed groove portions 42. In this example, a $CO_2$ laser is used and is scanned at a high speed by using a galvano-optical scanner. The grooves may be formed by grinding by using a grindstone or by shot blast instead of working by the irradiation with laser beam.

The first recessed groove portions 41 and the second recessed groove portions 42 that are formed have a groove depth of about 40 μm and a groove width of 60 μm.

Figure 7:
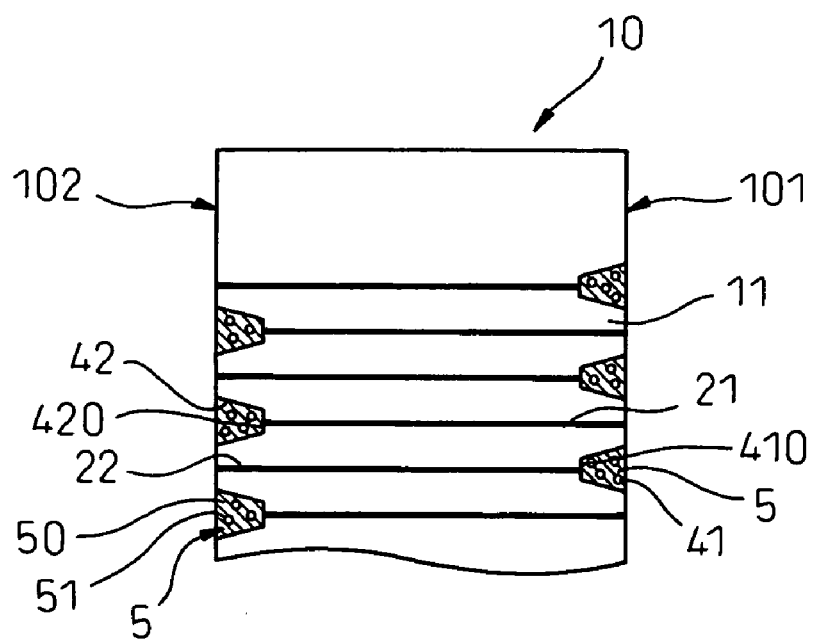
FIG. 7 is a schematic view illustrating a state where the first recessed groove portions and the second recessed groove portions are filled with the insulating filler material in Example 1.

Next, as shown in FIG. 7, the first recessed groove portions 41 and the second recessed groove portions 42 are coated with the insulating filler material 5 by using a dispenser, and are evacuated so as to be filled without gap relative to the inner surfaces of the first recessed groove portions 41 and the second recessed groove portions 42. In addition to the above coating method, there can be employed screen printing or metal mask printing. As described previously, the insulating filler material 5 comprises an epoxy resin as a base containing 60% by weight of an alumina filler.

Next, the insulating filler material 5 is heat-treated at a temperature of 180° C. for 60 minutes to cure the insulating resin 51. The insulating filler material 5 overflowing from the first recessed groove portions 41 and the second recessed groove portions 42 is cut off by the surface grinding.

Then, electrically conducting resin layers comprising the epoxy resin having added thereto 70% by weight of a silver filler (first side-surface electrode 31 and second side-surface electrode 32) are printed by a metal masking method, and are thermally cured at a temperature of 150° C. for 30 minutes. Thus, the electric conduction is maintained between the first side-surface electrode 31 and all of the first internal electrodes 21 on the side surface 101, and the electric conduction is maintained between the second side-surface electrode 32 and all of the second internal electrodes 22 on the side surface 102.

Further, lead wires 7 are joined to the first side-surface electrode 31 and to the second side-surface electrode 32 by using the epoxy resin to which the silver filler has been added. The laminated piezoelectric element 1 illustrated in FIG. 1 is thus obtained.

Described below are the function and effect of the laminated piezoelectric element 1 obtained in this example.

In the laminated piezoelectric element 1 of this example as described above, the insulating filler material 5 filled in the first recessed groove portions 41 and in the second recessed groove portions comprises the insulating resin 50 and the inorganic particles 51 contained therein. Therefore, the linear expansion coefficient of the insulating filler material 5 as a whole is much smaller than that of when the insulating resin 50 alone is used. The difference from the linear expansion coefficient of the piezoelectric layers 11 is very decreased as compared to that of the prior art.

Therefore, even when the cooling/heating cycle is repeated for the laminated piezoelectric element 1, the insulating filler material 5 filled in the first recessed groove portions 41 and in second recessed groove portions 42 is maintained in a healthy state suppressing the occurrence of cracks or gaps.

Therefore, the above laminated piezoelectric element 1 features improved reliability in the structure of insulation between the internal electrode layers 21 and 22 and the side-surface electrodes 31 and 32 as compared to the prior art.

In this example, further, an angle a (see, FIG. 2) which is an obtuse angle is subtended by the side surfaces 101 and 102 of the ceramic laminate 10 and by the side wall surfaces of the first recessed groove portions 41 and of the second recessed groove portions 42. Therefore, even when a stress is exerted on the side surfaces 101 and 102 of the ceramic laminate 10 due to displacement, stress concentrates little in the corner portions subtended by the side surfaces 101 and 102 of the ceramic laminate 10 and by the side wall surfaces of the first recessed groove portions 41 and of the second recessed groove portions 42, preventing the occurrence of cracks.

The first side-surface electrode 31 and the second side-surface electrode 32 are constituted by the electrically conducting resin layers obtained by containing the silver filler in an amount of 70% by weight in the epoxy resin, and the resin material has substantially the same composition as that of the insulating resin 50 of the insulating filler material 5. This enables the insulating filler material 5 to be strongly joined to the first side-surface electrode 31 and to the second side-surface electrode 32.

Due to the presence of the silver filler, the first side surface electrode 31 and the second side surface electrode 32 exhibit a linear expansion coefficient of about 100 ppm/° C. while the insulating filler material 5 exhibits a linear expansion coefficient in a range of 20 to 200 ppm/° C., which are close to each other. This contributes to further enhancing the junction stability between the two.

The internal electrode layers 21, 22 in this example use copper as the electrically conducting material. As compared to the case of using silver or silver-palladium alloy that is generally used as the internal electrode layers, therefore, it is allowed to suppress the generation of migration. It is, therefore, allowed to form the first recessed groove portions 41 and the second recessed groove portions 42 having a groove depth of 40 μm which is smaller than 50 μm to maintain favorable displacement characteristics.

Further, since the groove width W of the first recessed groove portions 41 and of the second recessed groove portions 42 is set to be 75% of the thickness L of the piezoelectric layer 11, an excess tensile stress is not exerted despite the laminated piezoelectric element 1 is displaced. Therefore, the effect of thermal stress is decreased in the cooling/heating cycles enhancing the effect for suppressing inconveniences such as cracks and peeling.

Though copper is used in this example as the internal electrode layers 21 and 22, the above-mentioned effect of the insulating filler material 5 can, as a matter of course, be obtained even by using the internal electrode layers containing silver or silver-palladium alloy that is usually used.

Figure 9:
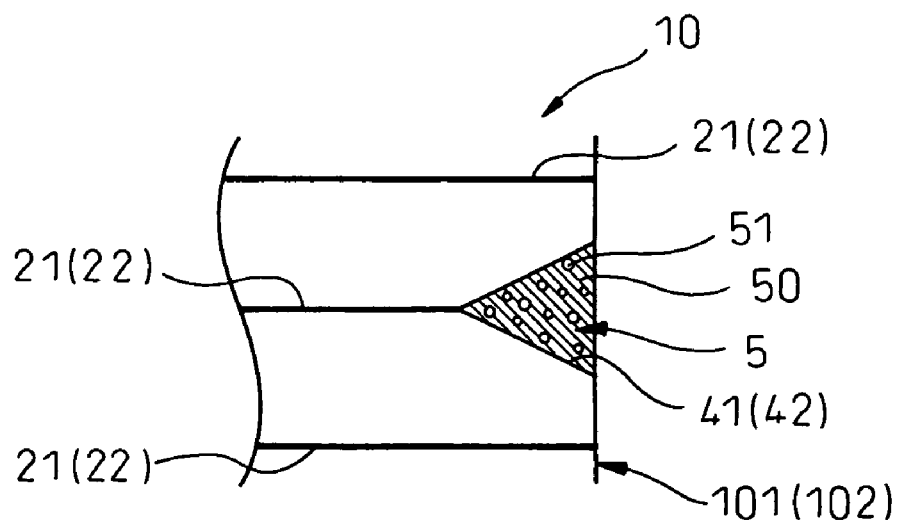
FIG. 9 is a schematic view illustrating another shape of the first recessed groove portions and of the second recessed groove portions in cross section in Example 1.
Figure 10:
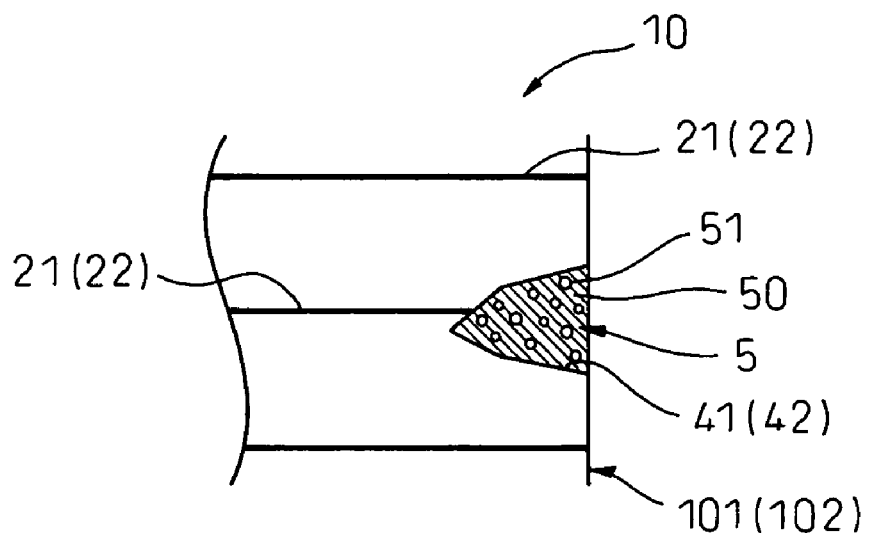
FIG. 10 is a schematic view illustrating a further shape of the first recessed groove portions and of the second recessed groove portions in cross section in Example 1.
Figure 11:
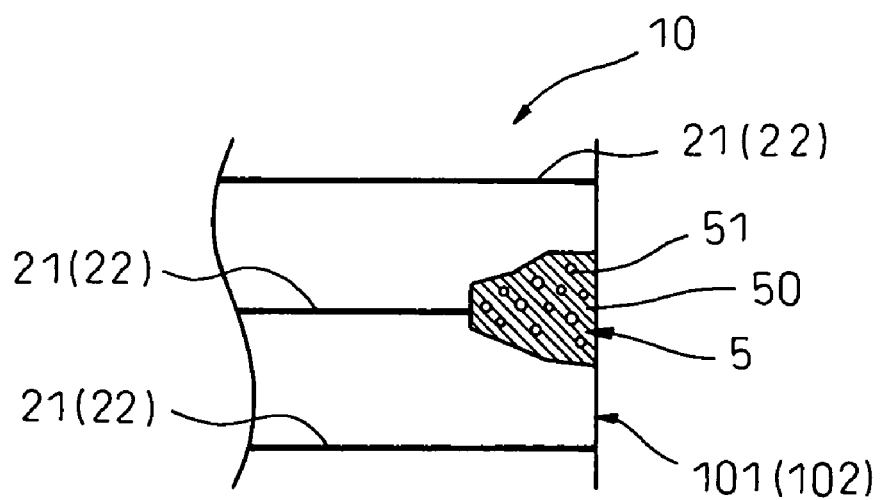
FIG. 11 is a schematic view illustrating a still further shape of the first recessed groove portions and of the second recessed groove portions in cross section in Example 1.

In this example, as described above, the first recessed groove portions 41 and the second recessed groove portions 42 have a trapezoidal shape in cross section. They, however, may be formed in a rectangular shape like in the prior art. As illustrated in FIGS. 9 to 11, however, it is desired that an obtuse angle is subtended by the side surfaces 101 and 102 of the ceramic laminate 10 and by the side wall surfaces 415 and 425 of the first recessed groove portions 41 and of the second recessed groove portions 42. FIG. 9 illustrates an example of a nearly triangular shape in cross section, and FIGS. 10 and 11 illustrate examples of nearly polygonal shapes which are biasymmetrical.

Example 2

In this example, there are prepared a plurality of laminated piezoelectric elements inclusive of the laminated piezoelectric element (sample E1) of Example 1, and a testing is conducted to compare their durabilities.

The laminated piezoelectric elements prepared in addition to the above sample E1 include two kinds of products of the invention (sample E2 and sample E3) and one kind of a conventional product (sample C1).

The sample E2 is a laminated piezoelectric element same as the sample E1 except that a silicon resin is used as the insulating resin for constituting the insulating filler material.

The sample E3 is a laminated piezoelectric element same as the sample E1 except that the groove depth of the first recessed groove portions and of the second recessed groove portions of the sample E1 is increased from 40 μm to 100 μm.

Figure 12:
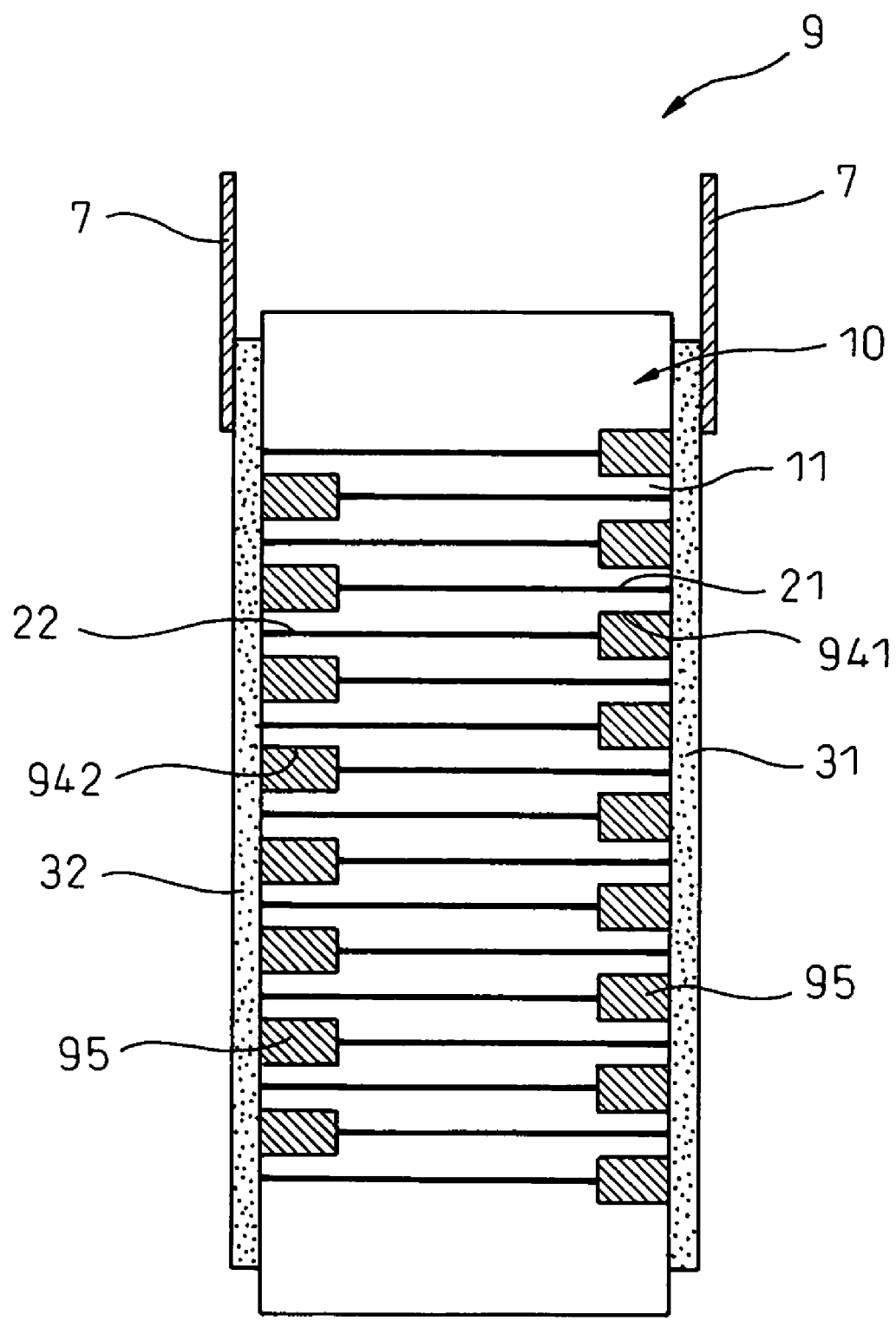
FIG. 12 is a schematic view illustrating the structure of a laminated piezoelectric element for comparison in Example 2.

The sample C1 is a conventional laminated piezoelectric element 9 which, as illustrated in FIG. 12, is different from the sample E1 in regard to that the first recessed groove portions 941 and the second recessed groove portions 942 have a rectangular shape in cross section and have a groove depth of 100 μm and that the insulating filler material 95 comprises an insulating 10 resin only without containing inorganic particles.

TABLE 1

| | | Sample No. | | | |
|---|---|---|---|---|---|
| | | Prior art product | Invention product | | |
| | | C1 | E1 | E2 | E3 |
| Piezoelectric material | | PZT | PZT | PZT | PZT |
| Internal electrode | | Ag-Pd10% | Cu | Cu | Cu |
| Groove shape | Sectional shape | rectangle | trapezoidal | trapezoidal | trapezoidal |
| | Depth | 100 μm | 40 μm | 40 μm | 100 μm |
| Insulating filler | Insulating resin | epoxy | epoxy | silicone | epoxy |
| | Inorganic particles | none | Alumina 60 wt % | Alumina 60 wt % | Alumina 60 wt % |
| | Linear expansion coefficient | 200 ppm/° C. | 40 ppm/° C. | 140 ppm/° C. | 40 ppm/° C. |
| Side electrodes | | epoxy-Ag | epoxy-Ag | epoxy-Ag | epoxy-Ag |
| Displacement (150 V, free of load) | | 40 μm | 45 μm | 45 μm | 40 μm |
| Cool/heat cycle | Life | 700 times | 1500 times | 1300 times | 1500 times |
| | Broken portion | cracks in insulating filler | peel between PZT and insulating filler | peel between side-surface electrode and insulating filler | peel between PZT and insulating filler |

A test was conducted to measure the above four kinds of samples for their displacement characteristics. The testing was carried out under the conditions of a driving voltage of 150 V with no load (free of load).

The test results are shown in Table 1 from which it is learned that the samples E1 and E2 having a groove depth of 40 μm in the recessed groove portions (first recessed groove portions and second recessed groove portions) produce a displacement amount which is larger by about 10% than the displacement amount of the samples E3 and C1 having a groove depth of 100 μm.

Next, the cooling/heating cycle testing was conducted under the conditions of 40 and 125° C. for 60 minutes, respectively. Next, the number of times of driving until the samples were broken was found, and the broken portions were observed. The results are shown in Table 1 above from which it is appreciated that the samples E1 to E3 which are the products of the present invention obviously have lives which are very longer than that of the sample C1 which is a prior art product.

From the difference in the broken portions, it is learned that the sample E2 using the silicone resin as the insulating resin finally develops peeling between the side-surface electrode and the insulating filler material having different kinds of resins, and the samples E1 and E3 finally develop peeling between the PZT (piezoelectric material) and the insulating filler material.

Example 3

In this example, the laminated piezoelectric element 1 of Example 1 is used as a piezoelectric actuator of an injector 6.

Figure 13:
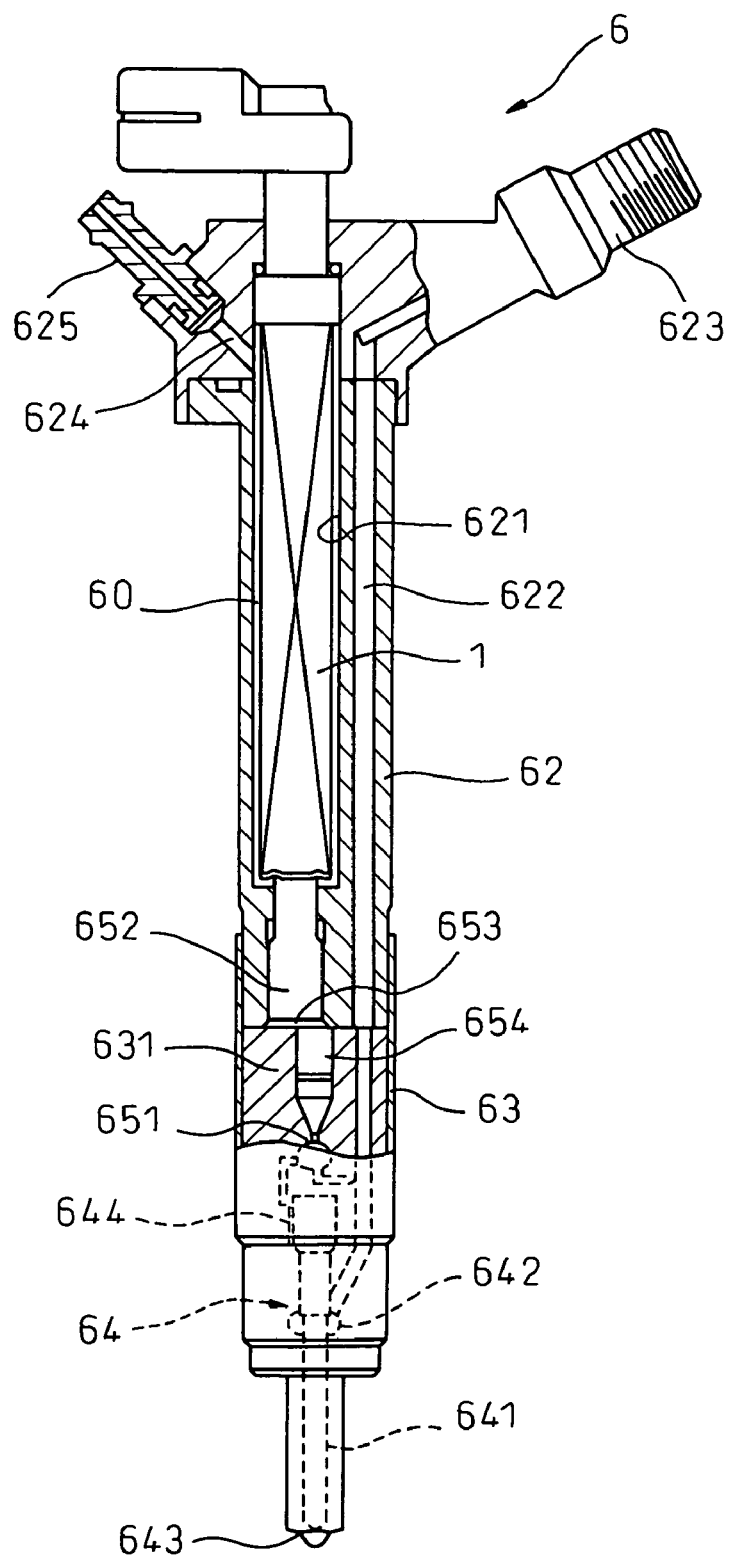
FIG. 13 is a schematic view illustrating the structure of an injector in Example 3.

As shown in FIG. 13, the injector 6 of this example is applied to a common rail injection system of diesel engines.

As shown, the injector 6 comprises an upper housing 62 accommodating the laminated piezoelectric element 1 that works as a drive unit, and a lower housing 63 secured to the lower end thereof and is forming an injection nozzle portion 64 therein.

The upper housing 62 is nearly of a cylindrical shape, and the laminated piezoelectric element 1 is inserted and secured in a vertical hole 621 that is deviated from the center axis.

A high-pressure fuel passage 622 is provided by the side of the vertical hole 621 in parallel therewith, and the upper end thereof is communicated with an external common rail (not shown) through a fuel introduction pipe 623 protruding beyond an upper side portion of the upper housing 62.

Further, a fuel lead pipe 625 communicated with a drain passage 624 is protruding from an upper side portion of the upper housing 62, and the fuel flowing out from the fuel lead pipe 625 is returned back to a fuel tank (not shown).

The drain passage 624 is communicated with a three-way valve 651 that will be described later passing through a gap 60 between the vertical hole 621 and the drive unit (piezoelectric element) 1 and through a passage that is not shown extending downward through the upper and lower housings 62 and 63 from the gap 60.

The injection nozzle portion 64 is provided with a nozzle needle 641 that slides up and down in a piston body 631, and an injection port 643 that is opened and closed by the nozzle needle 641 and injects, into the cylinders of the engine, the fuel of a high pressure fed from a fuel receiver 642. The fuel receiver 642 is provided around an intermediate portion of the nozzle needle 641, and the lower end of the high-pressure fuel passage 622 is opened in this portion. The nozzle needle 641 receives the fuel pressure in a direction of opening the valve from the fuel receiver 642 as well as the fuel pressure in a direction of closing the valve from a back pressure chamber 644 provided facing the upper end surface.

When the pressure in the back pressure chamber 644 decreases, the nozzle needle 641 is lifted up to open the injection port 643 permitting the fuel to be injected.

The pressure in the back pressure chamber 644 is increased or decreased by the three-way valve 651. The three-way valve 651 is so constituted as can be selectively communicated with the back pressure chamber 644 and with the high-pressure fuel passage 622 or with the drain passage 624. Here, the three-way valve 651 has a ball-like valve body for opening and closing the port communicated with the high-pressure fuel passage 622 or with the drain passage 624. The valve body is driven by the drive unit 1 through a large-diameter piston 652, a hydraulic pressure chamber 653 and a small-diameter piston 654 that are disposed under thereof.

In this example, the laminated piezoelectric element 1 described in example 1 is used as a drive source for the injector 6 constituted as described above. As described previously, the laminated piezoelectric element 1 has high reliability in the structure of insulation between the internal electrode layers 21 and 22 and the side-surface electrodes 31 and 32, and features very excellent durability. Even when the injector 6 is used under severe conditions in a high-temperature atmosphere, cracks are suppressed from occurring during the operation enhancing the durability. Therefore, the injector 6 as a whole features enhanced performance and reliability.

Example 4

In this example, the insulating resin constituting the insulating filler material and the inorganic particles contained therein are combined in a variety of ways to measure the coefficients of linear expansion and the tensile strengths.

Figure 14:
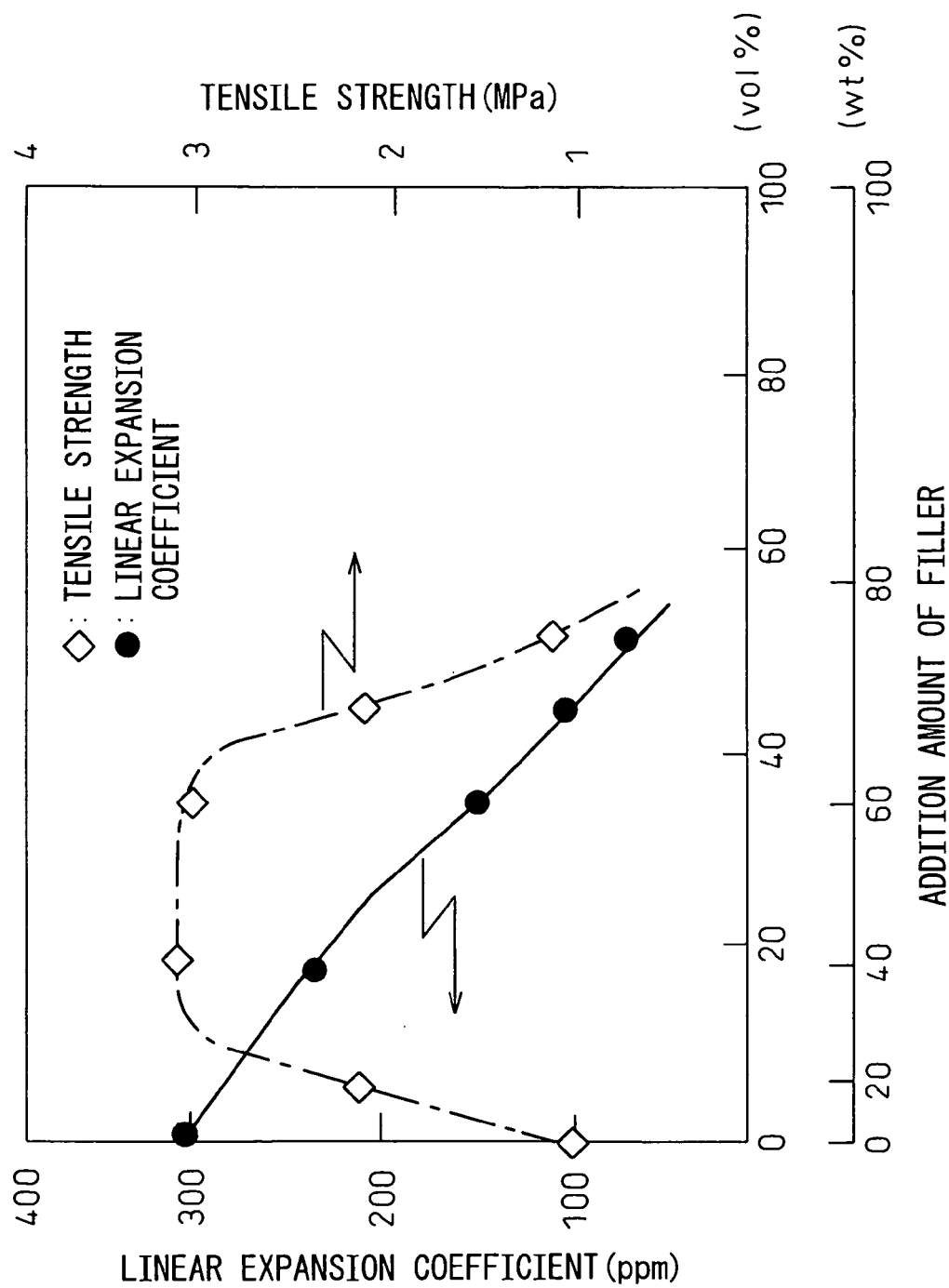
FIG. 14 is a graph showing relationships among the amount of addition of inorganic particles, linear expansion coefficient and tensile strength of when the insulating resin is silicone in Example 4.

First, FIG. 14 illustrates linear expansion coefficients and tensile strengths of an insulating filler material constituted by adding spherical alumina particles having an average particle size of 5 μm to a silicone resin (addition-type dimethylpolysiloxane).

The insulating filler material of the above constitution cured by heating is cut into a short strip to measure its linear expansion coefficient by using a TMA (thermo-mechanical analyzer).

Similarly, the insulating filler material cured by heating is cut into a short strip to measure its tensile strength by using an autograph.

In FIG. 14, the abscissa represents the amount of the added inorganic particles in both percent by weight (wt %) and percent by volume (vol %), and the ordinate on the left represents the linear expansion coefficient and the ordinate on the right represents the tensile strength.

As is appreciated from FIG. 14, the results of measurement are such that the linear expansion coefficient decreases as the alumina particles are added. On the other hand, the tensile strength increases as the alumina particles are added and decreases as the amount of addition thereof exceeds 60 wt %. This is due to that as the amount of addition of inorganic particles becomes too great, the insulating resin becomes no longer capable of anchoring the inorganic particles. From the standpoint of the linear expansion coefficient, therefore, it is desired that the inorganic particles are added in large amounts. From the standpoint of the tensile strength, however, a desired region of addition is from 30 to 60 wt %.

Next, FIG. 15 illustrates the linear expansion coefficient and the tensile strength of the insulating filler material obtained by adding spherical alumina particles having an average particle size of 5 μm to the epoxy resin (phenol novolak type epoxy resin).

The insulating filler material cured by heating is cut into a short strip in the same manner as described above to measure its linear expansion coefficient by using the TMA (thermo-mechanical analyzer). Similarly, the insulating filler material cured by heating is cut into a short strip to measure its tensile strength by using the autograph.

As is obvious from FIG. 15, the results of measurement are such that the linear expansion coefficient decreases as the alumina particles are added. As compared to when the silicone resin is used as the insulating resin of FIG. 14, the epoxy resin has a low linear expansion coefficient. As the inorganic particles are added, however, the linear expansion coefficient further decreases. As for the tensile strength, there is no large difference from when the alumina particles are added to the silicone resin. However, the strength remains great even when the inorganic particles are added since the epoxy resin by itself has a large strength.

Example 5

In this example, as shown in FIG. 16, recessed grooves of nearly a rectangular shape in cross section (see, FIG. 12) are employed as the first recessed groove portions 41 or as the second recessed groove portions 42 in the laminated piezoelectric element 1 of Example 1 to examine a relationship between the depth of the recessed grooves and the insulating property.

The insulating filler material that is used is the one obtained by adding spherical alumina particles having an average particle size of 5 μm to the silicone resin (addition-type dimethylpolysiloxane) of Example 4 (see, FIG. 14), the alumina particles being added in an amount of 60 wt %.

The results are shown in FIG. 16 wherein the abscissa represents the depth of the recessed grooves, the ordinate represents the applied voltage, X represents the defect due to short-circuit, Δ represents a decrease in the insulation resistance down to 1 GΩ or smaller, and ○ represents favorable insulation.

As will be appreciated from FIG. 16, as the applied voltage increases, the insulation resistance decreases (down to be not larger than 1 GΩ) and defect due to short-circuit is observed in the groove portions having shallow depths.

The invention claimed is:

1. A laminated piezoelectric element having a ceramic laminate formed by alternately laminating a plurality of piezoelectric layers comprising a piezoelectric material and a plurality of internal electrode layers having electric conductivity, the side surfaces of said ceramic laminate being provided with a first side-surface electrode and a second side-surface electrode, and said internal electrode layers comprising, being alternately arranged, the first internal electrodes conducting to said first side-surface electrode and the second internal electrodes conducting to said second side-surface electrode, in which the side surface of said ceramic laminate provided with said first side-surface electrode is further provided with first recessed groove portions which are the recessed grooves exposing the ends of said second internal electrodes in the bottom portions thereof, and the side surface thereof provided with said second side-surface electrode is further provided with second recessed groove portions which are the recessed grooves exposing the ends of said first internal electrodes in the bottom portions thereof, said first groove portions and said second groove portions are filled with an insulating filler material having electrically insulating property so as to cover the ends of said second internal electrodes and the ends of said first internal electrodes, and said insulating filler material comprises an insulating resin having electrically insulating property and inorganic particles comprising an inorganic material in said insulating resin.

2. A laminated piezoelectric element according to claim 1, wherein said inorganic particles comprise alumina, silica, silicon nitride or boron nitride.

3. A laminated piezoelectric element according to claim 1, wherein the content of said inorganic particles in said insulating filler material is 10 to 70% by weight.

4. A laminated piezoelectric element according to claim 1, wherein the content of said inorganic particles in said insulating filler material is 30 to 60% by weight.

5. A laminated piezoelectric element according to claim 1, wherein said inorganic particles have an average particle size of 0.1 to 30 μm.

6. A laminated piezoelectric element according to claim 1, wherein said inorganic particles have an average particle size of 1 to 10 μm.

7. A laminated piezoelectric element according to claim 1, wherein said insulating filler material has a linear expansion coefficient of 10 to 200 ppm/° C.

8. A laminated piezoelectric element according to claim 1, wherein said insulating filler material has a linear expansion coefficient of 10 to 100 ppm/° C.

9. A laminated piezoelectric element according to claim 1, wherein an angle subtended by the side surfaces of said ceramic laminate and by the side wall surfaces of said first recessed groove portions and of said second recessed groove portions is an obtuse angle.

10. A laminated piezoelectric element according to claim 1, wherein said first side-surface electrode and said second side-surface electrode are constituted by electrically conducting resin layers containing an electrically conducting material in a resin material, and said resin material has substantially the same composition as that of said insulating resin.

11. A laminated piezoelectric element according to claim 1, wherein said internal electrode layers contain copper as a main component thereof.

12. A laminated piezoelectric element according to claim 1, wherein said first recessed grooves and said second recessed grooves each has a depth of smaller than 50 μm.

13. A laminated piezoelectric element according to claim 1, wherein said first recessed grooves and said second recessed grooves each has a depth of not smaller than 10 μm and smaller than 50 μm.

14. A laminated piezoelectric element according to claim 1, wherein, when the thickness of the piezoelectric layer is denoted by L, said first recessed grooves and said second recessed grooves each has a width, which is the size in a direction in which the piezoelectric layers are laminated, lying in a range of 0.1L to 1.8L.

15. A laminated piezoelectric element according to claim 1, wherein the volume content of said inorganic particles in said insulating filler material is 3 to 45% by volume.

16. A laminated piezoelectric element according to claim 1, wherein said piezoelectric layers comprise a lead zirconate titanate which is an oxide of the formula $Pb(Zr,Ti)O_3$ having a perovskite structure.

17. An injector which is so constituted as to control the fuel injection by opening and closing a valve body by utilizing the displacement of a piezoelectric actuator, in which said piezoelectric actuator comprises a laminated piezoelectric element described in claims 1.

* * * * *